(12) United States Patent
Endo et al.

(10) Patent No.: US 10,263,034 B2
(45) Date of Patent: Apr. 16, 2019

(54) MEMBER FOR SOLID-STATE IMAGE PICKUP DEVICE AND METHOD FOR MANUFACTURING SOLID-STATE IMAGE PICKUP DEVICE

(71) Applicant: CANON KABUSHIKI KAISHA, Tokyo (JP)

(72) Inventors: Nobuyuki Endo, Fujisawa (JP); Tetsuya Itano, Sagamihara (JP); Kazuo Yamazaki, Yokohama (JP); Kyouhei Watanabe, Yokohama (JP); Junji Iwata, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/612,978

(22) Filed: Jun. 2, 2017

(65) Prior Publication Data

US 2017/0271387 A1    Sep. 21, 2017

Related U.S. Application Data

(60) Continuation of application No. 14/743,723, filed on Jun. 18, 2015, now Pat. No. 9,704,915, which is a (Continued)

(30) Foreign Application Priority Data

Jul. 9, 2010 (JP) ................................ 2010-156927

(51) Int. Cl.
*H01L 27/14* (2006.01)
*H01L 27/146* (2006.01)
*H01L 31/04* (2014.01)

(52) U.S. Cl.
CPC ...... *H01L 27/1469* (2013.01); *H01L 27/1464* (2013.01); *H01L 27/14634* (2013.01); (Continued)

(58) Field of Classification Search
CPC ........... H01L 27/1469; H01L 27/14689; H01L 31/04; H01L 27/14634; H01L 27/14636; H01L 27/1464; H01L 27/14687
See application file for complete search history.

(56) References Cited

U.S. PATENT DOCUMENTS

| 4,818,728 A | 4/1989 | Rai |
| 5,753,536 A | 5/1998 | Sugiyama |

(Continued)

FOREIGN PATENT DOCUMENTS

| JP | 8-227980 A | 9/1996 |
| JP | 9-82757 A | 3/1997 |

(Continued)

*Primary Examiner* — Tony Ko
(74) *Attorney, Agent, or Firm* — Canon U.S.A., Inc. IP Division

(57) ABSTRACT

A member for a solid-state image pickup device having a bonding plane with no gaps and a method for manufacturing the same are provided. The manufacturing method includes the steps of providing a first substrate provided with a photoelectric converter on its primary face and a first wiring structure, providing a second substrate provided with a part of a peripheral circuit on its primary face and a second wiring structure, and performing bonding so that the first substrate, the first wiring structure, the second wiring structure, and the second substrate are disposed in this order. In addition, at least one of an upper face of the first wiring structure and an upper face of the second wiring structure has a concave portion, and a conductive material forms a bottom face of the concave portion.

20 Claims, 11 Drawing Sheets

Related U.S. Application Data division of application No. 13/808,865, filed as application No. PCT/JP2011/003795 on Jul. 4, 2011, now Pat. No. 9,093,350.

(52) U.S. Cl.
CPC .. *H01L 27/14636* (2013.01); *H01L 27/14687* (2013.01); *H01L 27/14689* (2013.01); *H01L 31/04* (2013.01); *H01L 2224/05655* (2013.01)

(56) References Cited

U.S. PATENT DOCUMENTS

| | | |
|---|---|---|
| 2004/0157407 A1 | 8/2004 | Tong et al. |
| 2006/0146233 A1 | 7/2006 | Park |
| 2010/0276572 A1 | 11/2010 | Iwabuchi et al. |

FOREIGN PATENT DOCUMENTS

| | | |
|---|---|---|
| JP | 10-135404 A | 5/1998 |
| JP | 2006-191081 A | 7/2006 |
| JP | 2008-235478 A | 10/2008 |
| JP | 2009-4593 A | 1/2009 |
| JP | 2009-170448 A | 7/2009 |
| JP | 2011-009372 A | 1/2011 |
| JP | 2011-009489 A | 1/2011 |
| WO | 2007/001146 A1 | 1/2007 |

MEMBER FOR SOLID-STATE IMAGE PICKUP DEVICE AND METHOD FOR MANUFACTURING SOLID-STATE IMAGE PICKUP DEVICE

CROSS-REFERENCE TO RELATED APPLICATION

This application is the Continuation of U.S. patent application Ser. No. 14/743,723, filed 2015 Jun. 18; which is Divisional of U.S. patent application Ser. No. 13/808,865 filed Jan. 7, 2013, which now becomes U.S. Pat. No. 9,093,350 issued Jul. 28, 2015; which is a National Phase application of International Application PCT/JP2011/003795, filed Jul. 4, 2011, which claims the benefit of Japanese Patent Application No. 2010-156927, filed Jul. 9, 2010, are hereby incorporated by reference herein in their entirety.

TECHNICAL FIELD

The present invention relates to a bonding portion of a solid-state image pickup device.

BACKGROUND ART

In CCD type and amplification-type solid-state image pickup devices used for digital still cameras, camcorders, and the like, in order to obtain high definition images, the sizes of pixels are required to be reduced. However, as the sizes of pixels are reduced more and more, a light receiving area of a photoelectric converter, in a pixel, detecting light is decreased, and the sensitivity is decreased.

In PTL 1, a solid-state image pickup device has been disclosed in which in a CMOS type solid-state image pickup device, which is an amplification-type solid-state image pickup device, in order to ensure a light receiving area of a photoelectric converter, a first substrate provided with photoelectric converters and transfer transistors and a second substrate provided with other circuits are bonded to each other. In addition, in the solid-state image pickup device disclosed in PTL 1, a technique has been disclosed in which copper bonding pads are used when the first substrate and the second substrate are bonded together, and an insulating film around the copper bonding pads of the second substrate is recessed.

CITATION LIST

Patent Literature

[PTL 1]
Japanese Patent Laid-Open No. 2006-191081

SUMMARY OF INVENTION

Technical Problem

However, in the bonding method disclosed in PTL 1, the relationship between the coefficient of thermal expansion of the copper bonding pad and that of the insulating film has not been studied, and a gap may be generated at a bonding plane after the bonding. In addition, when a gap is generated around the copper bonding pad having a convex shape, copper forming the bonding pad may diffuse in some cases. When copper diffuses in the solid-state image pickup device, problems, such as generation of white spots, may arise.

Accordingly, the present invention provides a member for a solid-state image pickup device having a bonding plane for solving the above problem and a method for manufacturing the solid-state image pickup device.

Solution to Problem

The present invention provides a method for manufacturing a solid-state image pickup device which comprises the steps of: providing a first substrate provided with a photoelectric converter on its primary face and a first wiring structure disposed on the primary face of the first substrate; providing a second substrate provided with, on its primary face, a part of a peripheral circuit including a control circuit and a readout circuit reading out a signal based on a charge of the photoelectric converter and a second wiring structure disposed on the primary face of the second substrate; and performing boding so that the first substrate, the first wiring structure, the second wiring structure, and the second substrate are disposed in this order. In the manufacturing method described above, at least one of an upper face of the first wiring structure and an upper face of the second wiring structure has a concave portion, and a conductive material forms a bottom face of the concave portion.

In addition, the present invention provides a method for manufacturing a solid-state image pickup device which includes a first substrate provided with, on its primary face, a photoelectric converter and a transfer transistor transferring a charge of the photoelectric converter, a first wiring structure disposed on the primary face of the first substrate and having a first insulating film and a first bonding portion, a second substrate provided with, on its primary face, a part of a peripheral circuit portion including a control circuit and a readout circuit reading out a signal based on a charge of the photoelectric converter, and a second wiring structure disposed on the primary face of the second substrate and having a second insulating film and a second bonding portion, in which the first substrate, the first wiring structure, the second wiring structure, and the second substrate are disposed in this order, the method comprising:

a first step of forming the first insulating film and the first bonding portion on the first substrate; and a second step of forming the second insulating film and the second bonding portion on the second substrate. In the manufacturing method described above, in at least one of the first step and the second step, on the basis of the primary face of the first substrate, an upper face of the first bonding portion is lower than an upper face of the first insulating film; on the basis of the primary face of the second substrate, an upper face of the second bonding portion is lower than an upper face of the second insulating film; or the upper face of the first bonding portion is lower than the upper face of the first insulating film on the basis of the primary face of the first substrate, and the upper face of the second bonding portion is lower than the upper face of the second insulating film on the basis of the primary face of the second substrate.

Advantageous Effects of Invention

Accordingly, the present invention provides a member for a solid-state image pickup device having a bonding plane with no gaps and a method for manufacturing the solid-state image pickup device.

DESCRIPTION OF EMBODIMENTS

Figure 1:
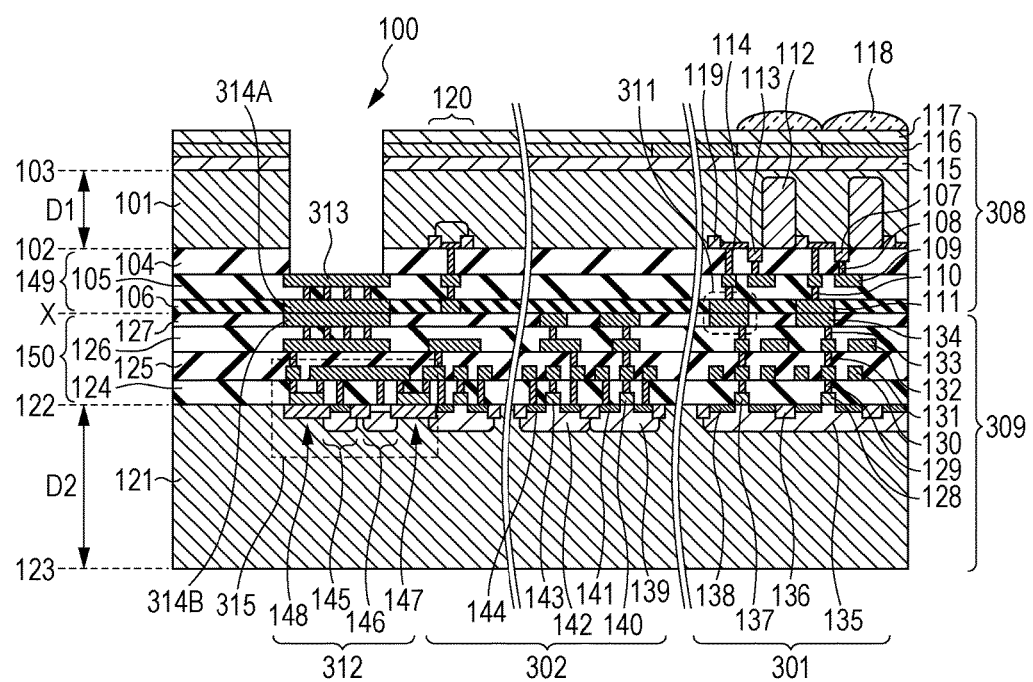
FIG. 1 is a schematic cross-sectional view of a solid-state image pickup device according to Embodiment 1.

A method for manufacturing a solid-state image pickup device of the present invention has the steps of providing a first substrate provided with photoelectric converters on its primary face and a first wiring structure disposed on the primary face of the first substrate, and providing a second substrate provided with apart of a peripheral circuit on its primary face and a second wiring structure disposed on the primary face of the second substrate. The method also has a step of performing bonding so that the first substrate, the first wiring structure, the second wiring structure, and the second substrate are disposed in this order. In addition, in this solid-state image pickup device, a concave portion is provided in at least one of an upper face of the first wiring structure and an upper face of the second wiring structure, and a bottom face of the concave portion includes a conductive material. By the structure as described above, a flat bonding plane can be obtained after the bonding.

Hereinafter, the present invention will be described in detail with reference to the drawings. In this embodiment, the primary face of the first substrate and the primary face of the second substrate are substrate surfaces on which transistors are formed. Opposite side faces (opposite side surfaces) facing the respective primary faces (primary surfaces) are a back face (back surface) of the first substrate and a back face (surface) of the second substrate. In addition, an upward direction indicates a direction from the back face toward the primary face of the substrate, and a downward direction and a depth direction each indicate a direction from the primary face toward the back face of the substrate. Furthermore, an upward direction based on a certain basis indicates the height, and a downward direction based on a certain basis indicates the depth. In the following descriptions, when the first and second substrates are bonded with each other, the back face of the second substrate is at the bottom face and the back face of the first substrate is at the top face.

Embodiment 1 of the present invention will be described with reference to FIGS. 1 to 6B. First, a circuit of a solid-state image pickup device according to Embodiment 1 will be described with reference to FIG. 3. In this embodiment, the case in which a signal electric charge is an electron will be described by way of example. The solid-state image pickup device shown in FIG. 3 has a pixel portion 301 in which a plurality of photoelectric converters is arranged and a peripheral circuit portion 302 having a peripheral circuit which includes a control circuit driving readout of a signal from the pixel portion 301 and a signal processing circuit processing a readout signal.

In the pixel portion 301, photoelectric converters 303, transfer transistors 304, amplification transistors 306, and reset transistors 307 are arranged. A structure including at least one photoelectric converter 303 is defined as a pixel. One pixel of this embodiment includes one photoelectric converter 303, one transfer transistor 304, one amplification transistor 306, and one reset transistor 307. A source of the transfer transistor 304 is connected to the photoelectric converter 303, and a drain region of the transfer transistor 304 is connected to a gate electrode of the amplification transistor 306. A node which is the same as the gate electrode of this amplification transistor 306 is defined as a node 305. The reset transistor 307 is connected to the node 305 and sets the electric potential thereof to an arbitrary electric potential (such as, a reset electric potential). In this structure, the amplification transistor 306 is a part of a source follower circuit and outputs a signal corresponding to the electric potential of the node 305 to a signal line RL. The node 305 may also be called a floating diffusion in some cases.

The peripheral circuit portion 302 indicates a region other than the pixel portion 301. In the peripheral circuit portion 302, a peripheral circuit including a readout circuit and a control circuit is disposed. The peripheral circuit has a vertical scanning circuit VSR which is a control circuit supplying control signals to the gate electrodes of the transistors of the pixel portion 301. In addition, the peripheral circuit has a readout circuit RC which maintains signals outputted from the pixel portion 301 and performs signal processing, such as amplification, addition, and AD conversion. Furthermore, the peripheral circuit has a horizontal scanning circuit HSR which is a control circuit controlling the timing for sequentially outputting signals from the readout circuit RC.

In addition, the solid-state image pickup device according to Embodiment 1 is formed by bonding two members to each other. The two members are a first member 308 having a first substrate 101 and a second member 309 having a second substrate 121. The photoelectric converters 303 and the transfer transistors 304 of the pixel portion 301 are arranged on the first substrate, and the amplification transistors 306 and the reset transistors 307 of the pixel portion 301 and at least a part of the peripheral circuit are arranged on the second substrate. For example, a control signal from the peripheral circuit of the second member 309 to the gate electrode of the transfer transistor 304 of the first member 308 is supplied via a bonding portion 310. The structure of the bonding portion 310 will be described later. A signal generated in the photoelectric converter 303 of the first member 308 is readout at the drain region of the transfer transistor 304, that is, at the node 305. The node 305 includes the structure formed in the first member 308 and the structure formed in the second member 309.

According to the structure as described above, compared to a related case in which all the pixel portion is disposed on one member (that is, on one large substrate), the area of the photoelectric converter 303 can be increased, and hence the sensitivity can be improved. In addition, compared to the related case in which all the pixel portion is disposed on one member (that is, on one large substrate), when the area of the photoelectric converter is not changed, the number of the photoelectric converters 303 can be increased, and hence the number of pixels can be increased. In addition, compared to the related case in which all the pixel portion and all the peripheral circuit portion are disposed on one member (that is, on one large substrate), it becomes easy to separately form the pixel portion and the peripheral circuit portion.

Figure 2A:
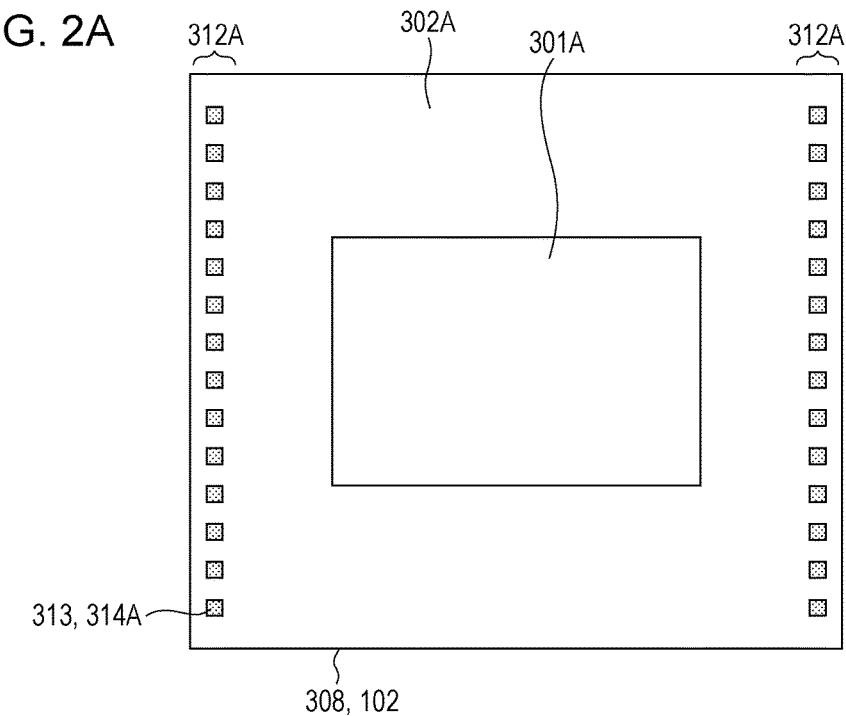
FIG. 2A is a schematic plan view of the solid-state image pickup device according to Embodiment 1.

A specific plan layout of the solid-state image pickup device as described above will be described using schematic plan views of a solid-state image pickup device shown in FIGS. 2A and 2B. FIG. 2A shows a plan layout of the first member 308, that is, the first substrate 101, and FIG. 2B shows a plan layout of the second member 309, that is, the second substrate 121.

Figure 3:
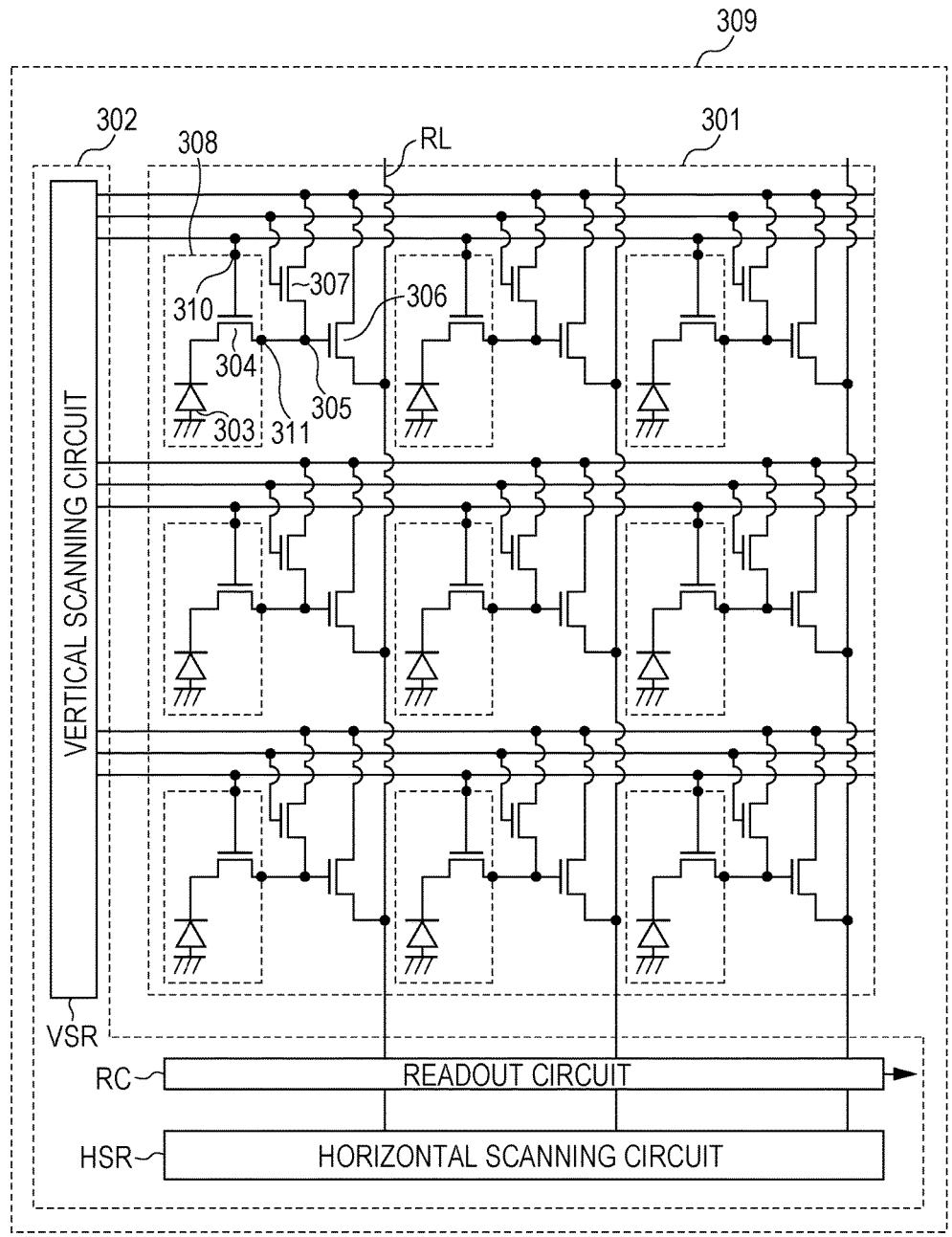
FIG. 3 is a circuit diagram of the solid-state image pickup device according to Embodiment 1.

In FIG. 2A, in the first member 308, there are disposed a pixel portion 301A in which photoelectric converters are arranged and pad portions 312A in each of which pads 313 are arranged. In the pixel portion 301A, the photoelectric converters 303, the transfer transistors 304, the bonding portions 310, and bonding portions 311 shown in FIG. 3 are disposed. In addition, bonding portions 314A for connection to the second member 309 are disposed at the same position as those of the pads 313 when viewed along a direction perpendicular to the primary face of the substrate 101. An external terminal is connected to the pad 313. The pads 313 are disposed in the solid-state image pickup device and include pads, each of which outputs a signal (image signal) based on a charge generated in the photoelectric converter, and pads to each of which a voltage or the like supplied from the outside to drive the peripheral circuit is inputted.

Figure 2B:
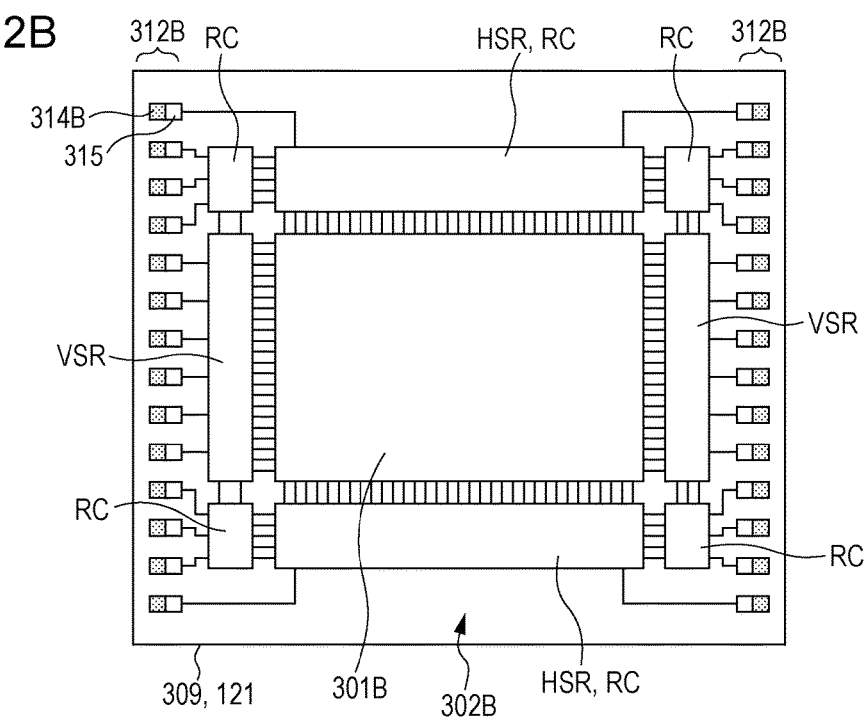
FIG. 2B is a schematic plan view of the solid-state image pickup device according to Embodiment 1.

Next, in FIG. 2B, a pixel portion 301B, the peripheral circuit portion 302, and pad portions 312B are disposed in the second member 309. A part of a pixel circuit is disposed in the pixel portion 301B, and the amplification transistors 306, the reset transistors 307, and the bonding portions 310 and 311 shown in FIG. 3 are disposed therein. A part of the peripheral circuit is disposed in the peripheral circuit portion 302, and the horizontal scanning circuits HSR, the vertical scanning circuits VSR, and the readout circuits RC are disposed therein. Bonding portions 314B for connection to the first member and protective diode circuits 315 are disposed in the pad portions 312B.

In addition, the first member 308 and the second member 309 which have the plan layouts shown in FIG. 2A and FIG. 2B, respectively, are bonded to each other to form the solid-state image pickup device of this embodiment. In particular, the pixel portion 301A and the pixel portion 301B are disposed so as to overlap with each other. In addition, the bonding portions 314A and the bonding portions 314B are bonded to each other, and the bonding portions 310 and the bonding portions 311 of the first member are bonded to the bonding portions 310 and the bonding portions 311 of the second member, respectively. In addition, in FIGS. 2A and 2B, a region of the first member 308 corresponding to a peripheral circuit portion 302B of the second member 309 is indicated by a peripheral circuit portion 302A. A part of the scanning circuit, that is, a part of the peripheral circuit, may be disposed in the peripheral circuit portion 302A. The structure of this bonding portion will be described later in detail.

Next, the solid-state image pickup device shown in FIGS. 2A, 2B, and 3 will be described with reference a schematic cross-sectional view shown in FIG. 1. In FIG. 1, the same constituent elements as those in FIGS. 2A, 2B, and 3 are designated by the same reference numerals as those described above, and description will be omitted.

The first member 308 has a first wiring structure 149 and the first substrate 101. The first substrate 101 is, for example, a silicon semiconductor substrate and has a primary face 102 and a back face 103. The transistors are arranged on the primary face 102 of the first substrate. The first wiring structure 149 has interlayer insulating films 104 to 106, a gate electrode layer 107 containing gate electrodes and wires, wiring layers 109 and 111 containing wires, and contact layers 108 and 110 containing contacts and/or vias. In this embodiment, the numbers of the interlayer insulating film, the wiring layer, and the contact layer included in the first wiring structure 149 may be arbitrarily determined. In addition, the wiring layer 111 of the first wiring structure 149 contains the bonding portions.

In the pixel portion 301 of the first member 308, an n-type semiconductor region 112 forming the photoelectric converter, an n-type semiconductor region 114 functioning as the drain of the transfer transistor, and an element isolation structure 119 are disposed in the first substrate 101. The transfer transistor is formed of the n-type semiconductor region 112, the n-type semiconductor region 114, and a gate electrode 113 contained in the gate electrode layer 107. A charge stored in the n-type semiconductor region 112 is transferred to the n-type semiconductor region 114 by the gate electrode 113. An electric potential based on the charge transferred to the n-type semiconductor region 114 is transmitted to the second member 309 via the contact of the contact layer 108, the wire of the wiring layer 109, the via of the contact layer 110, and the wire of the wiring layer 111. The wire of this wiring layer 111 forms the bonding portion 311. In addition, the photoelectric converter may be a buried photodiode further having a p-type semiconductor region or a photogate and may be appropriately changed.

A planarizing layer 115, a color filter layer 116 containing a plurality of color filters, a planarizing layer 117, and a microlens layer 118 containing a plurality of microlenses are disposed in this order in the pixel portion 301 at a back face 103 side of the first substrate 101. In FIG. 1, although each of the color filters and each of the microlenses are provided for one photoelectric converter, that is, are provided in each pixel, one color filter and one microlens may be provided for a plurality of pixels. The solid-state image pickup device of this embodiment is a so-called back-side illumination-type solid-state image pickup device in which light is incident from a microlens layer 118 side and is received by a photoelectric converter.

In the pad portion 312A of the first member 308, the pads 313 and openings 100 which expose the pads 313 for connection to an external terminal are provided. In addition, the bonding portions 314A, each of which transmits a voltage inputted from the pad 313 to the second member 309, are disposed. In addition, in the first member 308, as shown in FIG. 1, an optional circuit element 120 may be provided in a region corresponding to the peripheral circuit portion 302B of the second member 309. Hereinafter, the bonding portion indicates a portion at which the conductive material of the first member and the conductive material of the second member, which collectively form an electrical connection, are boned to each other and also indicates the conductive material before bonding.

The second member 309 has a second wiring structure 150 and the second substrate 121. The second substrate 121 is, for example, a silicon semiconductor substrate and has a primary face 122 and aback face 123. The transistors are arranged on the primary face 122 of the second substrate. The second wiring structure 150 has interlayer insulating films 124 to 127, a gate electrode layer 128 containing gate electrodes and wires, wiring layers 130, 132, and 134 containing wires, and contact layers 129, 131, 133 containing contacts and/or vias. In this embodiment, the numbers of the interlayer insulating film, the wiring layer, and the contact layer included in the second wiring structure 150 may be arbitrarily determined. In addition, the wiring layer 134 contains the bonding portions.

In the pixel portion 301 of the second member 309, a well 135 forming the amplification transistor which forms the pixel circuit, an n-type semiconductor region 138 forming source/drain regions of the amplification transistor, and an element isolation structure 136 are disposed in the second substrate 121. The amplification transistor is disposed in the well 135 and is formed of a gate electrode 137 contained in the gate electrode layer 128 and the n-type semiconductor region 138 forming the source/drain regions. In this embodiment, the bonding portion 311 of the first member 308 and the gate electrode 137 of the amplification transistor are connected to each other through the wire of the wiring layer 134, the via of the contact layer 133, the wire of the wiring layer 132, the via of the wiring layer 131, the wire of the wiring layer 130, and the contact of the contact layer 129. In this case, the node 305 shown in FIG. 3 is formed of the n-type semiconductor region 114, the wires of the wiring layers 109, 111, 134, 132, and 130, the contacts and/or vias of the contact layers 108, 110, 133, 131, and 129, and the gate electrode 137 shown in FIG. 1. Other circuits (such as the reset transistor) of the pixel portion 301 are not shown in the figure.

Next, at least a part of the peripheral circuit including the control circuits, such as the horizontal scanning circuit and the vertical scanning circuit, and the readout circuits is disposed in the peripheral circuit portion 302B of the second member 309. FIG. 1 shows an n-type transistor and a p-type transistor in an optional circuit included in the peripheral circuit. An n-type transistor formed of a gate electrode 140 contained in the gate electrode layer 128 and n-type source/drain regions 141 is disposed in a p-type well 139. In addition, a p-type transistor having a gate electrode 143 contained in the gate electrode layer 128 and a p-type semiconductor region 144 forming p-type source/drain regions is disposed in an n-type well 142.

In addition, in the pad portion 312B of the second member 309, there are disposed the protective diode circuit 315 inputting a signal from the pad 313 of the first member 308 and the bonding portion 314B for bonding to the first member 308. Two diodes 145 and 146 each formed from the semiconductor region and two resistors 147 and 148 formed from the gate electrode layer 128 are contained in the protective diode circuit 315 of this embodiment. However, a commonly-used protective diode circuit can be applied to the protective diode circuit 315.

In addition, in the solid-state image pickup device according to this embodiment, the primary face 102 of the first substrate 101 and the primary face 122 of the second substrate 121 are disposed to face each other with the first and second wiring structures provided therebetween (facing arrangement). That is, the first substrate, the first wiring structure, the second wiring structure, and the second substrate are disposed in this order. In addition, it can also be the that an upper face of the first wiring structure 149 and an upper face of the second wiring structure 150 are bonded to each other at a bonding plane X. That is, the first member 308 and the second member 309 are bonded to each other at the bonding plane X. The bonding plane X is formed from the upper face of the first wiring structure 149 and the upper face of the second wiring structure 150. In addition, the pad 313 of the solid-state image pickup device for exchanging a signal with the outside is disposed above the primary face 122 of the second member 309, and the opening 100 is provided at a first member 308 side.

In this embodiment, in the first wiring structure 149, the wiring layer 109 is formed of wires (aluminum wires) primarily composed of aluminum, and the wiring layer 111 is formed of wires (copper wires) primarily composed of copper. In addition, in the second wiring structure 150, the contact layer 131 and the wiring layer 132 are formed of aluminum wires, and the wiring layer 134 is formed of copper wires. In this case, the bonding portion 311 and the bonding portion 314A contained in the wiring layer 111 formed of copper wires are bonded to the bonding portion 311 and the bonding portion 314B contained in the wiring layer 134 formed of copper wires, respectively, at the bonding plane X by metal bonding. In addition, in the pad portion, the pad 313 for connection to an external terminal is disposed in the same layer as that of the wiring layer 109, that is, at the same height as that thereof, and is a conductive material primarily composed of aluminum. Incidentally, the height is a height from the primary face 102 of the first substrate 101.

Figure 4A:
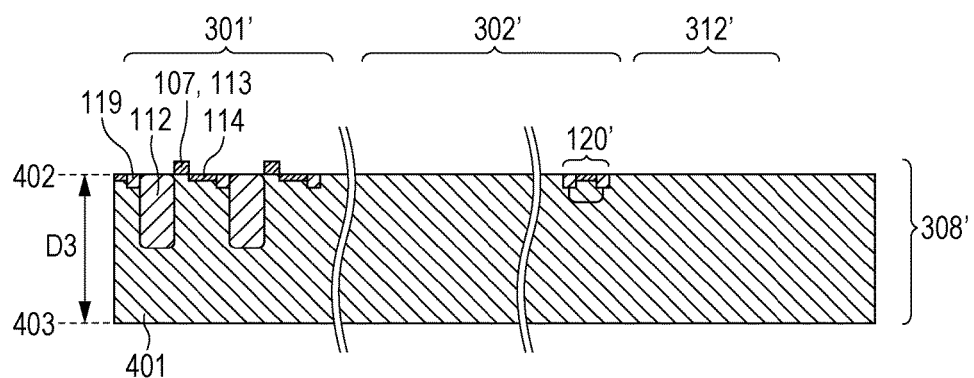
FIG. 4A is a schematic cross-sectional view illustrating a step of a method for manufacturing the solid-state image pickup device according to Embodiment 1.
Figure 4B:
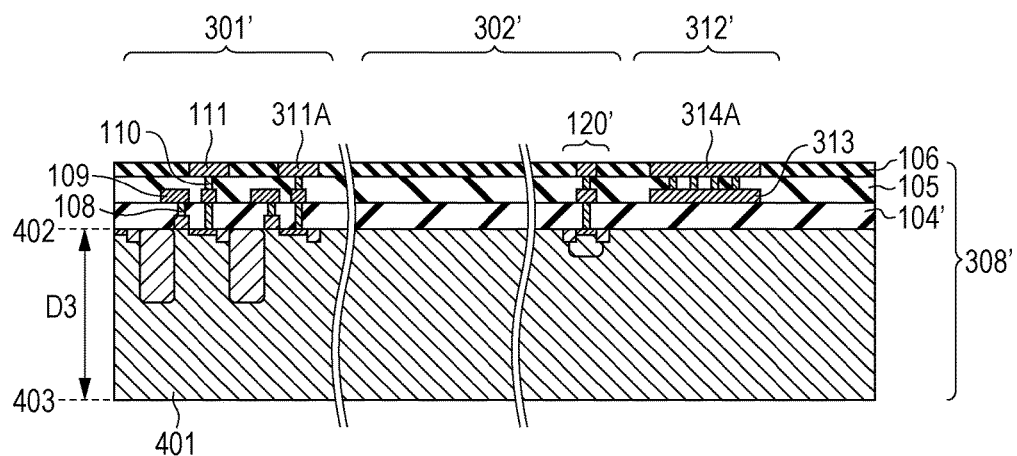
FIG. 4B is a schematic cross-sectional view illustrating a step of the method for manufacturing the solid-state image pickup device according to Embodiment 1.
Figure 5A:
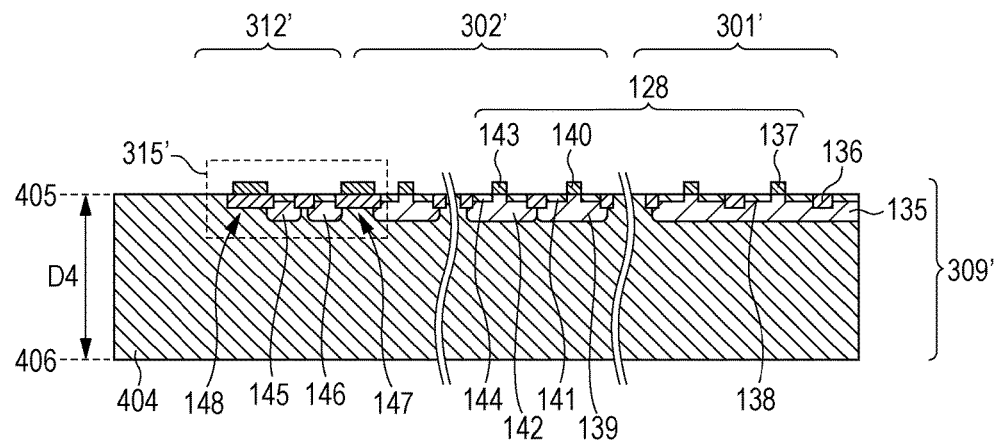
FIG. 5A is a schematic cross-sectional view illustrating a step of the method for manufacturing the solid-state image pickup device according to Embodiment 1.
Figure 5B:
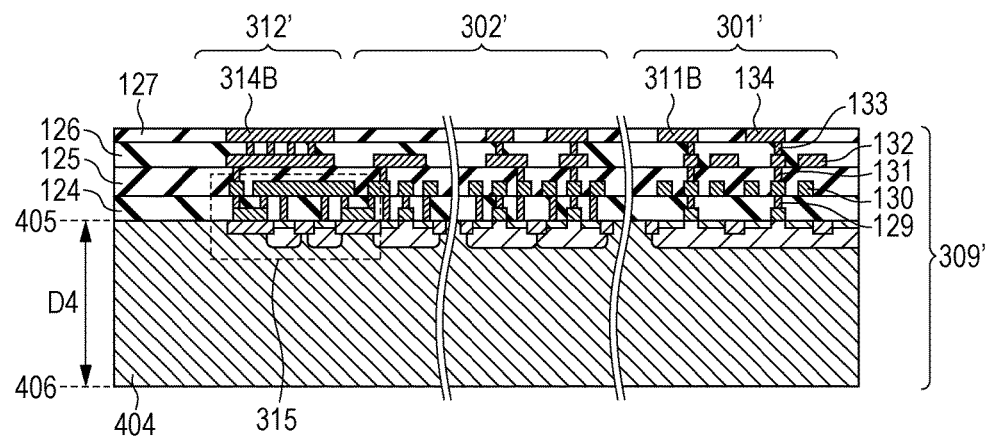
FIG. 5B is a schematic cross-sectional view illustrating a step of the method for manufacturing the solid-state image pickup device according to Embodiment 1.
Figure 6A:
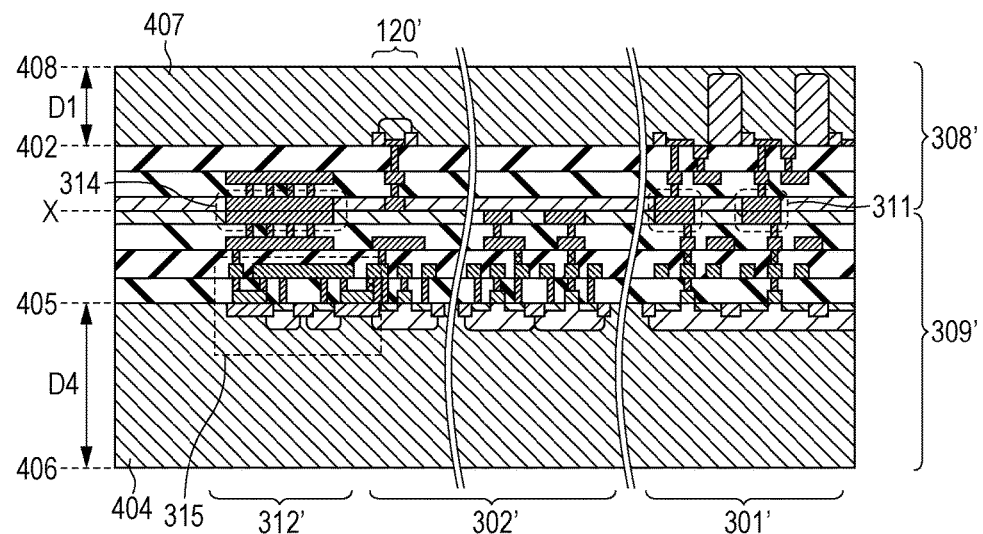
FIG. 6A is a schematic cross-sectional view illustrating a step of the method for manufacturing the solid-state image pickup device according to Embodiment 1.
Figure 6B:
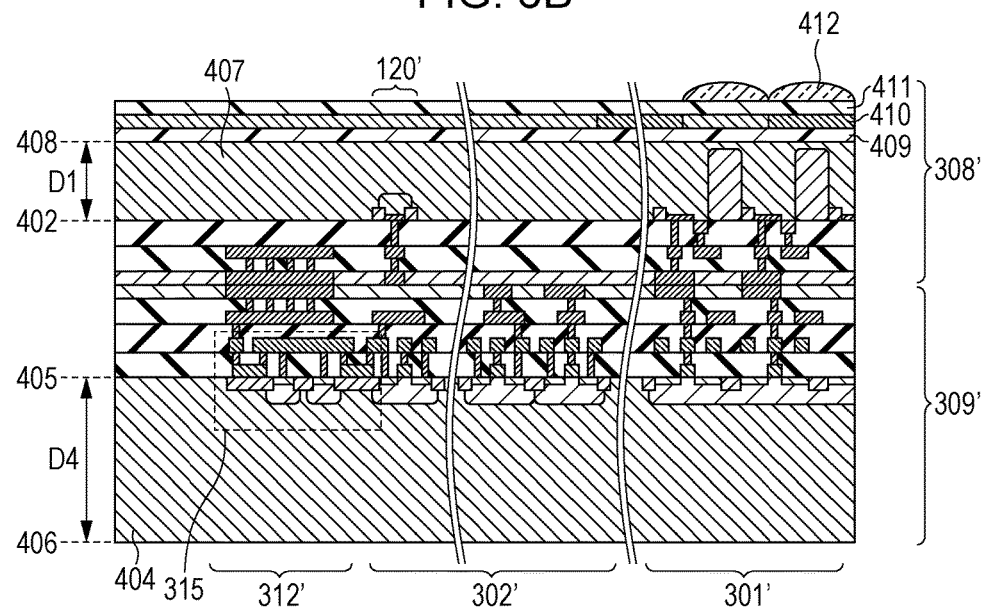
FIG. 6B is a schematic cross-sectional view illustrating a step of the method for manufacturing the solid-state image pickup device according to Embodiment 1.

Next, a method for manufacturing the solid-state image pickup device of this embodiment will be described with reference to FIGS. 4A to 6B. FIGS. 4A and 4B are each a schematic cross-sectional view showing a step of manufacturing the first member 308, FIGS. 5A and 5B are each a schematic cross-sectional view showing a step of manufacturing the second member 309, and FIGS. 6A and 6B are each a schematic cross-sectional view showing a manufacturing step performed after the first member 308 and the second member 309 are bonded to each other.

Steps of manufacturing the first member 308 shown in FIG. 1 will be described with reference to FIGS. 4A and 4B. In FIGS. 4A and 4B, a structure to be later formed into the first member 308 shown in FIG. 1 is represented by 308', and portions to be formed into the pixel portion 301, the peripheral circuit portion 302, the pad portion 312, and the circuit element 120, which is a part of the peripheral circuit, shown in FIG. 1 are represented by 301', 302', 312', and 120', respectively.

First, a semiconductor substrate is provided, and elements are formed in the semiconductor substrate. A semiconductor substrate 401 of a thickness D3 having a primary face 402 and a back face 403 is provided. The semiconductor substrate 401 is, for example, a silicon semiconductor substrate. The element isolation structure 119 is formed in the semiconductor substrate 401. The element isolation structure 119 contains an insulating material, such as a silicon oxide film, and has, for example, a LOCOS or an STI structure. In addition, a well (not shown) having an arbitrary conductivity type is formed in the semiconductor substrate 401. Subsequently, the n-type semiconductor regions 112 and 114 and a p-type semiconductor region (not shown), which form a photoelectric converter and a transistor, are formed. In addition, the gate electrode layer 107 containing the gate electrode 113 of the transfer transistor is formed. The gate electrode layer is formed, for example, by deposition and patterning of a polysilicon layer and may contain a wire as well as the gate electrode. Methods for forming the gate electrode, element isolation, and semiconductor region may be performed in accordance with a general semiconductor process, and detailed description will be omitted. The structure shown in FIG. 4A is obtained by the steps described above.

Next, the wiring structure is formed on the primary face 402 of the semiconductor substrate 401. The wiring structure has an interlayer insulating film 104', the interlayer insulating films 105 and 106, the contact layers 108 and 110, and the wiring layers 109 and 111. In this embodiment, the interlayer insulating film 104' is later formed into the interlayer insulating film 104 shown in FIG. 1. The interlayer insulating film 104' covers the gate electrode layer 107, the contact layer 108 is disposed in the interlayer insulating film 104', and the wiring layer 109 is disposed on the interlayer insulating film 104'. In addition, the interlayer insulating film 105 covers the wiring layer 109, the contact layer 110 is disposed in the interlayer insulating film 105, the wiring layer 111 is disposed on the interlayer insulating film 105, and the interlayer insulating film 106 is disposed on the interlayer insulating film 105 and has openings to expose the wires of the wiring layer 111. The upper face of the wiring structure is formed of the upper face of the interlayer insulating film 106 and the upper face of the wiring layer 111.

In this embodiment, the interlayer insulating films 104', 105, and 106 are each a silicon oxide film. However, the interlayer insulating films 104', 105, and 106 may also be formed, for example, of a silicon nitride film or an organic resin. The contact 108 and the via 110 are formed, for example, from tungsten. The wiring layer 109 is formed of wires primarily composed of aluminum, and the wiring layer 111 is formed of wires primarily composed of copper. The wiring layer 111 contains the bonding portion 314A and a bonding portion 311A, and the wiring layer 109 contains the pad 313. The wires of the wiring layer primarily composed of copper can be formed by a single damascene method in which after a groove is formed in the interlayer insulating film, a barrier metal and/or copper is filled in the groove. The wires of the wiring layer primarily composed of aluminum can be formed by patterning a barrier metal and/or an aluminum film formed on the interlayer insulating film using a photolithographic and an etching technique. Methods for manufacturing these wiring layer, contact layer, and interlayer insulating film can be performed in accordance with a general semiconductor process, and detailed description will be omitted. The structure shown FIG. 4B is obtained by the steps described above. In FIG. 4B, the portions represented by reference numerals 104', 105, 106, 108, 109, 110, and 111 are later used to form the first wiring structure 149 shown in FIG. 1. In addition, the bonding portion 311A later forms the bonding portion 311.

In this FIG. 4B, the upper face of the first wiring structure 149 which later forms the bonding plane X shown in FIG. 1 is formed of the upper face of the interlayer insulating film 106 and the upper face of each wire of the wiring layer 111. The structure of this upper face forming this bonding plane X will be described later in detail.

Next, steps of manufacturing the second member 309 shown in FIG. 1 will be described with reference to FIGS. 5A and 5B. In FIGS. 5A and 5B, a structure to be later formed into the second member 309 shown in FIG. 1 is represented by reference numeral 309', and portions to be formed into the pixel portion 301, the peripheral circuit portion 302, the pad portion 312, and the protective diode circuit 315 shown in FIG. 1 are represented by reference numerals 301', 302', 312', and 315', respectively.

First, a semiconductor substrate is provided, and elements are formed in the semiconductor substrate. A semiconductor substrate 404 of a thickness D4 having a primary face 405 and a back face 406 is provided. Next, the element isolation structure 136 is formed in the semiconductor substrate 404 using a LOCOS or an STI structure. In addition, the p-type wells 135 and 139 and the n-type well 142 are formed in the semiconductor substrate 404. Subsequently, the n-type semiconductor regions 138 and 141 and the p-type semiconductor region 144, each of which is to be formed into the source/drain regions of the transistor, and a semiconductor region forming a diode are formed. In addition, the gate electrode layer 128 containing the gate electrodes 137, 140, and 143 of the transistors and wires (resistors) is formed by deposition and patterning of a polysilicon layer. In this case, methods for forming the gate electrode, element isolation, and semiconductor region can be performed in accordance with a general semiconductor process, and detailed description will be omitted. The structure shown in FIG. 5A is obtained by the steps described above.

Next, the wiring structure is formed on the primary face 405 of the semiconductor substrate 404. The wiring structure has the interlayer insulating films 124 to 127, the contact layers 129, 131, and 133, and the wiring layers 130, 132, and 134. The interlayer insulating film 124 covers the gate electrode layer 128, the contact layer 129 is disposed in the interlayer insulating film 124, and the wiring layer 130 is disposed on the interlayer insulating film 124. In addition, the interlayer insulating film 125 covers the wiring layer 130, the contact layer 131 is disposed in the interlayer insulating film 125, the wiring layer 132 is disposed on the interlayer insulating film 125, and the interlayer insulating film 126 is disposed on the interlayer insulating film 125 to cover the wiring layer 132. In addition, the contact layer 133 is disposed in the interlayer insulating film 126, the wiring layer 134 is disposed on the interlayer insulating film 126, and the interlayer insulating film 127 is disposed on the interlayer insulating film 126 and also has openings to expose the wiring layer 134. The upper face of the wiring structure is formed of the upper face of the interlayer insulating film 127 and the upper face of the wiring layer 134.

In this case, the interlayer insulating films 124 to 127 are each a silicon oxide film. The interlayer insulating films 124 to 127 may also be formed, for example, of a silicon nitride film or an organic resin. The contact 129 and the vias 131 and 133 are formed, for example, of tungsten. The wiring layers 130 and 132 are each formed of wires primarily composed of aluminum, and the wiring layer 134 is formed of wires primarily composed of copper. The wiring layer 134 contains the bonding portion 314B and a bonding portion 311B. The wires of the wiring layer primarily composed of copper can be formed by a single damascene method in which after a groove is formed in the interlayer insulating film, a barrier metal and/or copper is filled in the groove. The wires of the wiring layer primarily composed of aluminum can be formed by patterning a barrier metal and/or an aluminum film formed on the interlayer insulating film using a photolithographic and an etching technique. Methods for manufacturing these wiring layer, contact layer, and interlayer insulating film can be performed in accordance with a general semiconductor process, and detailed description will be omitted. Accordingly, the structure shown in FIG. 5B is obtained by the steps described above. In FIG. 5B, the portions represented, for example, by reference numerals 124 to 127 and 129 to 134 are later used to form the second wiring structure 150 shown in FIG. 1. In addition, the bonding portion 311B later forms the bonding portion 311.

In this FIG. 5B, the upper face of the second wiring structure which later forms the bonding plane X shown in FIG. 1 is formed of the upper face of the interlayer insulating film 127 and the upper face of each wire of the wiring layer 134. The wiring layer 134 is also a conductive material to be used as the bonding portion. That is, the upper face of the second wiring structure contains the upper face of the conductive material. The structure of the upper face of this second wiring structure will be described later in detail.

The first member 308' and the second member 309' as shown in FIGS. 4B and 5B, respectively, are bonded together so that the primary face 402 and the primary face 405 of the respective semiconductor substrates face each other. That is, the uppermost face of the wiring structure of the first member 308' and the uppermost face of the wiring structure of the second member 309' are boned to each other. In this embodiment, since the bonding portions 311A and 311B and the bonding portions 314A and 314B are formed of wires primarily composed of copper, when bonding is performed therebetween, metal bonding of copper may be performed. By this bonding, besides the metal bonding of copper, the bonding is also performed between the insulating films. Accordingly, the two wiring structures are formed into one wiring structure containing the bonding portions.

After the first member 308' and the second member 309' are bonded together, the thickness of the semiconductor substrate 401 of the first member 308' is reduced at a back face 403 side. The reduction of the thickness may be performed by CMP or etching. Accordingly, the semiconductor substrate 401 is formed into a semiconductor substrate 407, and the thickness is changed from D3 to D1 (D1<D3) (FIG. 6A). As described above, since the thickness of the semiconductor substrate 401 is reduced to form the semiconductor substrate 407, subsequently, incident light is able to efficiently enter the photoelectric converter. In addition, at this stage, the thickness D1 of the semiconductor substrate 407 is smaller than the thickness D4 of the semiconductor substrate 404.

Next, a planarizing layer 409 formed of a resin, a color filter layer 410, a planarizing layer 411 formed of a resin, and a microlens layer 412 are formed in this order on a back face 408 of the semiconductor substrate 407. Methods for manufacturing these planarizing layer, color filter layer, and microlens layer can be performed in accordance with a general semiconductor process, and detailed description will be omitted. In this case, the microlens layer may be formed to the region 312' which is to be formed into the pad portion. The structure shown in FIG. 6B is obtained by the steps described above.

In addition, the opening 100 is formed to expose the pad 313. In this step, a photoresist mask having an arbitrary opening is formed on the microlens layer 412 using a photolithographic technique. In addition, using a dry etching technique, the microlens layer 412, the planarizing layer 411, the color filter layer 410, the planarizing layer 409, the semiconductor substrate 407, and the interlayer insulating film 104' are partially removed, thereby forming the opening 100 to expose the pad 313.

Accordingly, the microlens layer 118, the planarizing layers 117 and 115, the color filter layer 116, the first substrate 101, and the interlayer insulating film 104 are formed. As a result, the structure shown in FIG. 1 is obtained. The semiconductor substrate 404, the primary face 405, the back face 406, and the thickness D4 shown in FIG. 6B correspond to the second substrate 121, the primary face 122, the back face 123, and the thickness D2 shown in FIG. 1, respectively. Although the thickness D4 is not changed from the thickness D2 in this case, the thickness of the semiconductor substrate 404 may be reduced so that the thickness D2 is smaller than the thickness D4. Although the number of steps is increased by the reduction in thickness, the solid-state image pickup device can be miniaturized.

Hereinafter, a process for forming the bonding plane X will be described with reference to FIGS. 7A to 7E, focusing on the bonding portion 311A (first bonding portion) shown in FIG. 4B and the bonding portion 311B (second bonding portion) shown in FIG. 5B. FIGS. 7A to 7E are each a cross-sectional view focusing on the bonding portion. The description of the structure other than the bonding portion will be omitted.

Figure 7A:
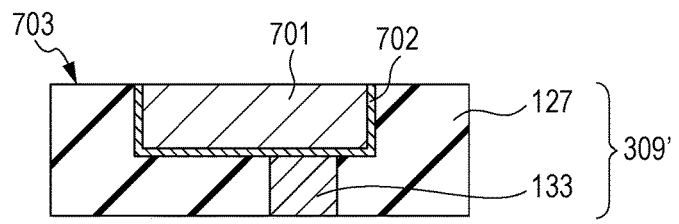
FIG. 7A is a schematic cross-sectional view of a bonding portion of the solid-state image pickup device according to Embodiment 1.

First, a process for forming the bonding portion 311B shown in FIG. 5B will be described from the beginning. FIG. 7A shows one bonding portion 311B. First, after a film to be formed into the interlayer insulating film 127 is formed, a groove to be used for the wire is formed in the interlayer insulating film 127. Next, a film of a conductive material 701 and a film of a barrier metal 702, each of which forms the bonding portion, are formed in the groove in the interlayer insulating film 127. Excessive films of the conductive material 701 and the barrier metal 702 are removed by CMP or the like, thereby forming the structure shown in FIG. 7A. In this case, the conductive material contains copper as a primary component, and the barrier metal contains tantalum and/or titanium. A method for forming this conductive material 701 and the barrier metal 702 is a single damascene method, and more detailed description will be omitted.

Figure 7B:
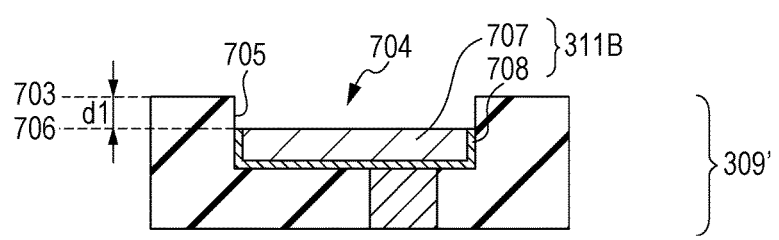
FIG. 7B is a schematic cross-sectional view of the bonding portion of the solid-state image pickup device according to Embodiment 1.

Next, by wet etching, dry etching, or CMP, the conductive material 701 is partially removed to form the bonding portion 311B shown in FIG. 7B. This step of partially removing the conductive material 701 may be simultaneously performed with the step of removing the excessive films of the conductive material 701 and the barrier metal 702 in the single damascene method described above. The bonding portion 311B shown in FIG. 7B contains a conductive material 707 and a barrier metal 708. In FIG. 7B, the second wiring structure of the second member 309' has a concave portion 704 in the upper face. The upper face of the second wiring structure of the second member 309' is formed of an upper face 703 of the interlayer insulating film 127 (second insulating film) and an upper face 706 of the bonding portion 311B. A bottom face of the concave portion 704 is the upper face 706 of bonding portion 311B, and the interlayer insulating film 127 is exposed at a side face 705 of the concave portion 704. A step d1 is formed between the upper face 703 of the interlayer insulating film 127 and the upper face 706 of the bonding portion 311B. This structure shown in FIG. 7B is the structure shown in FIG. 5B. Although description is performed with reference to FIG. 7B focusing on one of the bonding portions 311B, it is assumed that every bonding portion disposed in the upper face of the second wiring structure is processed in a manner similar to that described above and has a similar structure to that described above. In addition, the barrier metal 702 may also be partially removed when the conductive material 701 is partially removed.

Figure 7C:
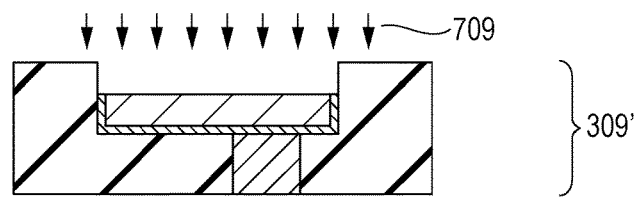
FIG. 7C is a schematic cross-sectional view of the bonding portion of the solid-state image pickup device according to Embodiment 1.

Next, as shown in FIG. 7C, in a mixed gas atmosphere of oxygen and nitrogen, plasma irradiation 709 is performed on the upper face of the second member 309', that is, on the upper face of the second wiring structure, so that the face thereof is activated. By performing this plasma irradiation, compared to the case in which plasma irradiation is not performed, bonding between the interlayer insulating films, such as a silicon oxide film and/or a silicon nitride film, can be more strengthened. In addition, instead of using plasma irradiation, an activation method by a chemical treatment may also be used.

Figure 7D:
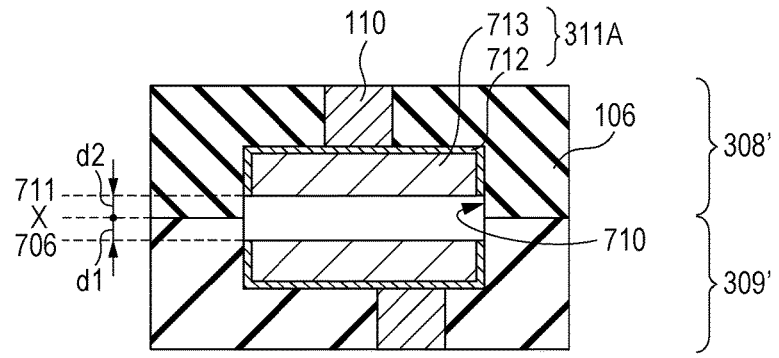
FIG. 7D is a schematic cross-sectional view of the bonding portion of the solid-state image pickup device according to Embodiment 1.
Figure 7E:
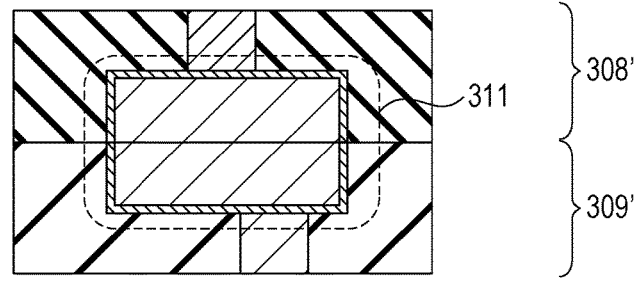
FIG. 7E is a schematic cross-sectional view of the bonding portion of the solid-state image pickup device according to Embodiment 1.

Hereinafter, in FIGS. 7D and 7E, the bonding steps shown in FIGS. 6A and 6B will be described in detail. First, the second member 309' processed by the treatment shown in FIG. 7C and the first member 308' processed in a manner similar to that performed on the second member 309' as shown in FIGS. 7A to 7C are provided and are bonded together as shown in FIG. 7D. The upper face of the first wiring structure of the first member 308' has the upper face of the interlayer insulating film 106 (first insulating film) and an upper face 711 of the bonding portion 311A and has a concave portion. A bottom face of the concave portion is the upper face 711 of the bonding portion 311A, and the interlayer insulating film 106 is exposed at a side face 710 of the concave portion. In addition, the upper face of the interlayer insulating film 106 and the upper face 711 of the bonding portion 311A form a step d2. The first member 308' and the second member 309' as described above are bonded together to form the bonding plane X. A heat treatment is performed when the bonding is performed. Accordingly, the bonding portions 311A and 311B are bonded together, the interlayer insulating films 106 and 127 are bonded together, and as a result, the bonding portion 311 as shown in FIG. 6A is formed (FIG. 7E). In addition, from the step shown in FIG. 7A to the step shown in FIG. 7E, the process is preferably performed in a vacuum or an inert gas atmosphere. The reason for this is to prevent the upper faces of the bonding portion 311A and 311B from being oxidized.

Since the bonding portion 311A and the bonding portion 311B are each formed to have a concave portion, a flat bonding plane X with no gaps can be formed in the bonding step shown in FIG. 7D. The reason for this is that, in general, a conductive material, such as copper, forming a bonding portion has a high coefficient of thermal expansion as compared to that of an insulating material, such as a silicon oxide or a silicon nitride film, forming an interlayer insulating film. As for the coefficient of thermal expansion ($\times 10^{-6}$/K), for example, copper has 16.8, a silicon oxide film has 0.6 to 0.9, and a silicon nitride film has 2.8 to 3.2. Accordingly, when the bonding portion 311A and the bonding portion 311B are each formed to have a concave portion as described in this embodiment, a flat bonding plane X can be formed.

The present invention is not limited to the steps described in the manufacturing method according to this embodiment, and the order of the steps may also be changed. In addition, the order of manufacturing the first member 308 and the second member 309 may be appropriately determined. Furthermore, an SOI substrate may also be applied to each of the semiconductor substrates 401 and 404.

In addition, it is also possible that the first member 308 and the second member 309 are separately provided as the substrates for the solid-state image pickup device and are then bonded together. For example, there may be mentioned a first member having a first substrate and a first wiring structure which has a wiring layer containing wires primarily composed of copper and a wiring layer containing wires primarily composed of aluminum. In this case, the upper face of at least one of the members may have the structure as shown in FIG. 7B. By providing the first member or the second member as described above, the solid-state image pickup device of this embodiment can be manufactured.

Next, Embodiment 2 of the present invention will be described with reference to FIGS. 8A to 8E. FIGS. 8A to 8E are cross-sectional views corresponding to FIGS. 7A to 7E, respectively, focusing on the bonding portion. In FIGS. 8A to 8E, constituent elements similar to those shown in FIGS. 7A to 7E are designated by the same reference numerals as those described above, and description will be omitted. The point of this embodiment different from that shown in FIGS. 7A to 7E is that as shown in FIG. 8D, the upper face of the first wiring structure of the first member 308' has not a concave portion and is flat.

Figure 8A:
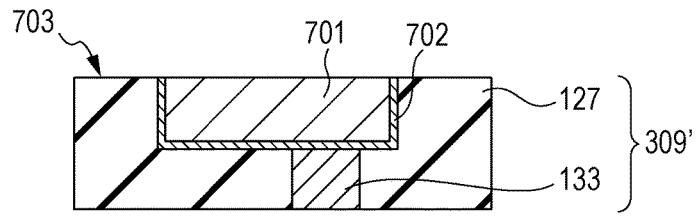
FIG. 8A is a schematic cross-sectional view of a bonding portion of a solid-state image pickup device according to Embodiment 2.
Figure 8B:
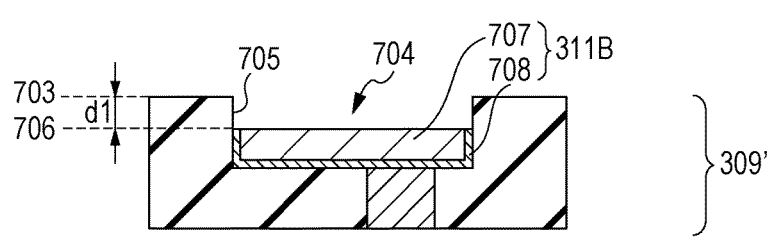
FIG. 8B is a schematic cross-sectional view of the bonding portion of the solid-state image pickup device according to Embodiment 2.
Figure 8C:
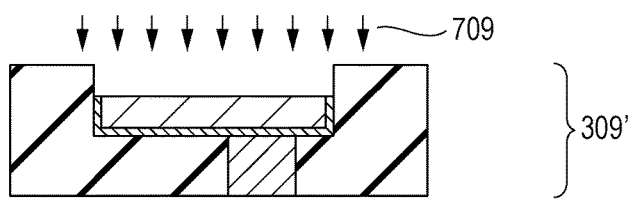
FIG. 8C is a schematic cross-sectional view of the bonding portion of the solid-state image pickup device according to Embodiment 2.
Figure 8D:
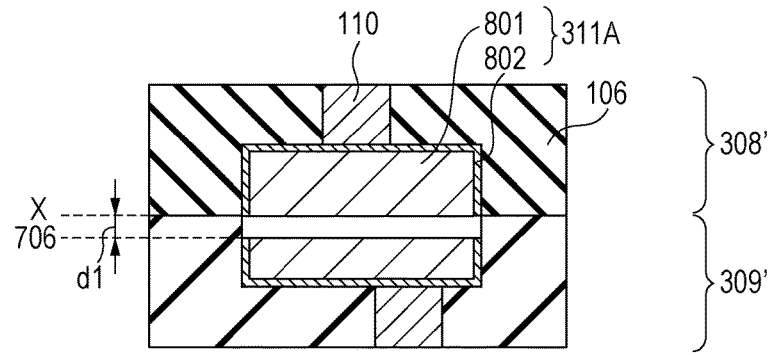
FIG. 8D is a schematic cross-sectional view of the bonding portion of the solid-state image pickup device according to Embodiment 2.
Figure 8E:
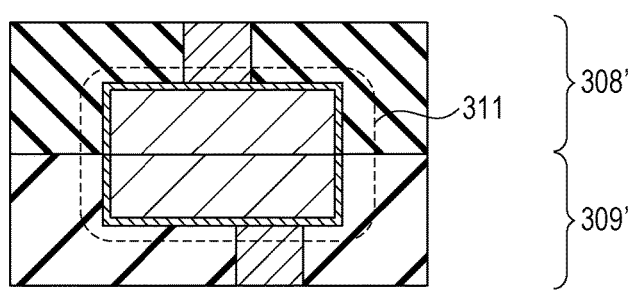
FIG. 8E is a schematic cross-sectional view of the bonding portion of the solid-state image pickup device according to Embodiment 2.

FIGS. 8A to 8C are the same views as those of FIGS. 7A to 7C, respectively, and the same treatments as those shown FIGS. 7A to 7C are performed on the second member 309'. In Embodiment 1, although the first member 308' is also processed in a manner similar to that performed on the second member 309', the first member 308' is not processed in this embodiment. That is, the upper face of the first wiring structure of the first member 308' is formed of the upper face of the bonding portion 311A (wiring layer 111) and the upper face of the interlayer insulating film 106, so that the upper face is flat and has no concave portion. The first member 308' and the second member 309' as described above are bonded to each other, so that the bonding plane X is formed. The other steps are the same as those described with reference to FIGS. 7A to 7E of Embodiment 1. In this embodiment, the bonding portion 311A has a conductive material 801 and a barrier metal 802.

When the upper face of at least one of the members has a concave portion, the bottom face of which is the bonding portion, the generation of gaps at the bonding plane can be suppressed which is caused by the difference in thermal expansion between the materials at the bonding.

Next, Embodiment 3 of the present invention will be described with reference to FIGS. 9A to 9E. FIGS. 9A to 9E are schematic cross-sectional views, focusing on the bonding portion, corresponding to those shown in FIGS. 7A to 7E, respectively. In FIGS. 9A to 9E, constituent elements similar to those shown in FIGS. 7A to 7E are designated by the same reference numerals as those described above, and description will be omitted.

Figure 9A:
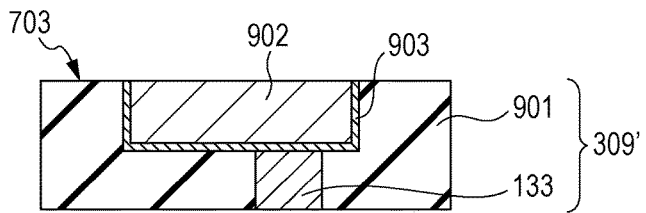
FIG. 9A is a schematic cross-sectional view of a bonding portion of a solid-state image pickup device according to Embodiment 3.
Figure 9B:
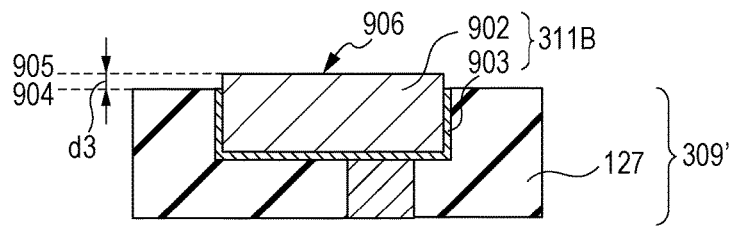
FIG. 9B is a schematic cross-sectional view of the bonding portion of the solid-state image pickup device according to Embodiment 3.
Figure 9C:
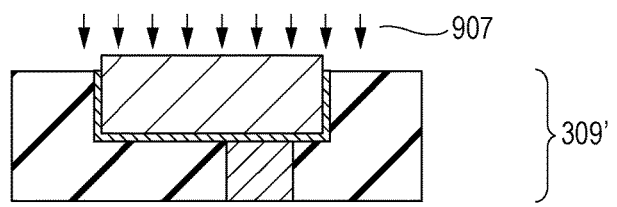
FIG. 9C is a schematic cross-sectional view of the bonding portion of the solid-state image pickup device according to Embodiment 3.
Figure 9D:
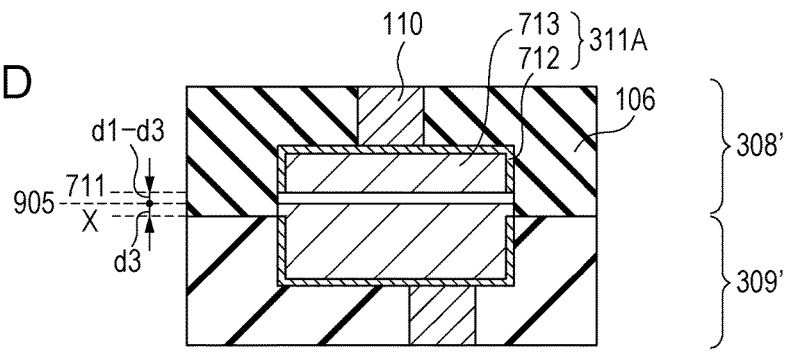
FIG. 9D is a schematic cross-sectional view of the bonding portion of the solid-state image pickup device according to Embodiment 3.
Figure 9E:
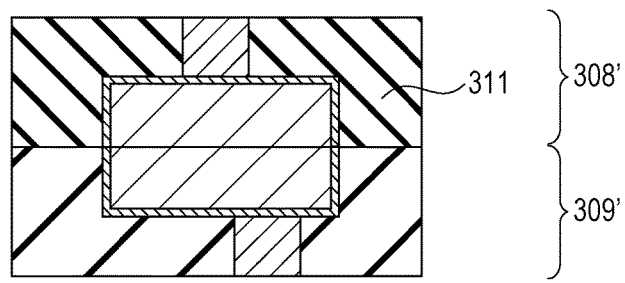
FIG. 9E is a schematic cross-sectional view of the bonding portion of the solid-state image pickup device according to Embodiment 3.

In FIGS. 9A to 9C, the second member 309' is processed so that the bonding portion of the upper face of the second wiring structure has a convex shape. That is, in FIG. 9A, the second member 309' has an interlayer insulating film 901, a conductive material 902, and a barrier metal 903, the latter two of which are to be formed into the bonding portion 311B, similar to those shown in FIG. 7A.

Next, the interlayer insulating film 901 is partially removed by wet etching, dry etching, or a CMP treatment. As shown in FIG. 9B, the interlayer insulating film 127 is formed, and the conductive material 902 functioning as the bonding portion forms a convex portion. That is, the upper face of the second wiring structure contains an upper face 904 of the interlayer insulating film 127 and an upper face 905 of the bonding portion 311B and has a convex portion 906. The upper face of the convex portion 906 is the upper face 905 of the bonding portion 311B, and the bonding portion 311B is exposed at a side face of the convex portion. In addition, the upper face 904 of the interlayer insulating film 127 and the upper face 905 of the bonding portion 311B form a step d3. Furthermore, as in the case shown in FIG. 7C, plasma irradiation 907 is performed on the upper face of the second wiring structure (FIG. 9C). Next, although not shown in the figure, treatments similar to those shown FIGS. 7A to 7C are performed on the first member 308'. That is, the upper face of the first member 308' has a concave portion. The first member 308' and the second member 309' as described above are bonded at the bonding plane X, thereby forming the bonding portion 311 shown in FIG. 9E.

As described above, since the upper face of at least one of the members has a concave portion, the bottom face of which is the bonding portion, even if the convex portion is provided on the upper face of the other member, the generation of gaps at the bonding plane can be suppressed which is caused by the difference in thermal expansion between the materials at the bonding.

Next, the structure of the bonding portion of each of the above embodiments, that is, the structure of the upper face of the first or the second wiring structure, will be described with reference to FIGS. 10A to 10H. FIGS. 10A to 10D are each a schematic cross-sectional view of the concave portion of the upper face of the second wiring structure, and FIGS. 10E to 10H are each a schematic plan view thereof. The schematic plan view shows a layout of elements on the upper face of the second wiring structure, and the schematic cross-sectional view shows the cross-section of that shown in the schematic plan view taken along the line of each figure. In FIGS. 10A to 10H, constituent elements described in Embodiments 1 to 3 are designated by the same reference numerals as those described above, and description will be omitted.

Figure 10A:
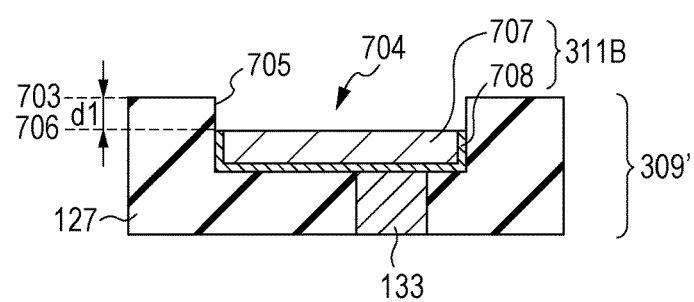
FIG. 10A is a schematic cross-sectional view illustrating a modification of a bonding portion.
Figure 10B:
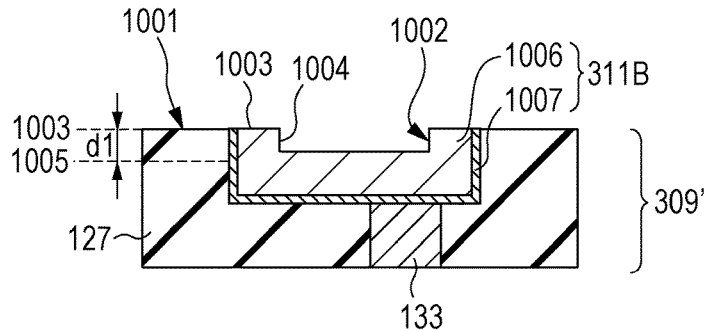
FIG. 10B is a schematic cross-sectional view illustrating a modification of a bonding portion.
Figure 10C:
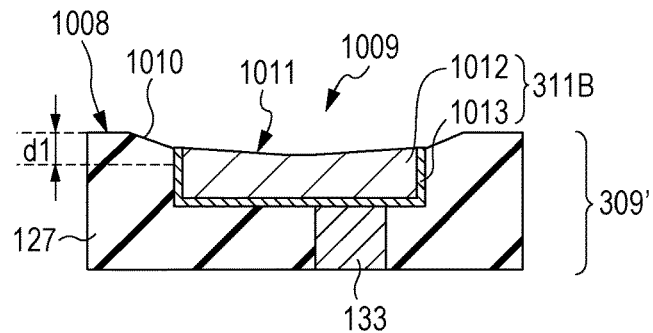
FIG. 10C is a schematic cross-sectional view illustrating a modification of a bonding portion.
Figure 10D:
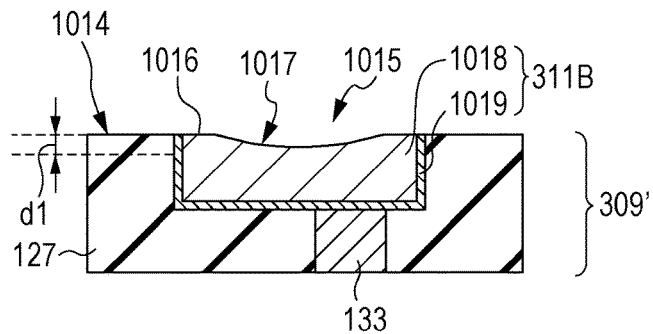
FIG. 10D is a schematic cross-sectional view illustrating a modification of a bonding portion.
Figure 10E:
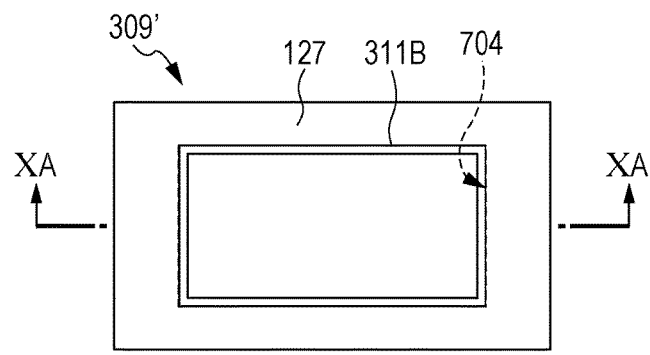
FIG. 10E is a schematic plan view illustrating the modification of the bonding portion.

FIG. 10A shows the same structure as that shown in FIG. 7B, and FIG. 10E is a schematic plan view corresponding to that shown in FIG. 10A. As shown in the schematic plan view of FIG. 10E, it is found that the area of the concave portion 704 is almost the same as that of the bonding portion 311B. This structure is applicable to the concave portion of the present invention.

Figure 10F:
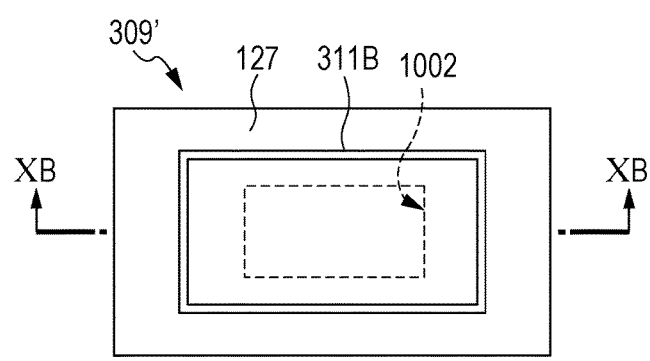
FIG. 10F is a schematic plan view illustrating the modification of the bonding portion.

Next, Modification 1 will be described with reference to FIGS. 10B and 10F. FIGS. 10B and 10F are a schematic cross-sectional view and a schematic plan view, respectively, corresponding to each other and show the structure in which the area of the concave portion is small as compared to that shown in FIGS. 10A and 10E. In FIG. 10B, a conductive material 1006 and a barrier metal 1007 form the bonding portion 311B. In addition, the upper face of the second wiring structure has an upper face 1001 of the interlayer insulating film, a concave portion 1002, and an upper face 1003 of a part of the bonding portion 311B. In the concave portion 1002, the bottom face is a part of an upper face 1005 of the bonding portion 311B, and the bonding portion 311B is exposed at a side face 1004. In addition, the upper face 1001 of the interlayer insulating film 127 and the upper face 1005 of the bonding portion 311B at the concave portion form a step d1. As shown in FIG. 10F, the concave portion 1002 has an area smaller than that of the bonding portion 311B. The structure as described above is also applicable to the concave portion of the present invention.

Figure 10G:
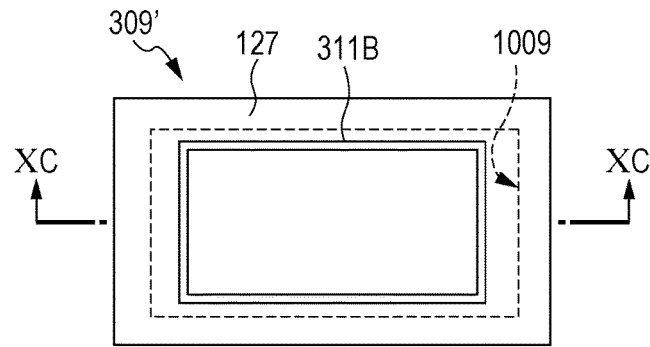
FIG. 10G is a schematic plan view illustrating the modification of the bonding portion.

Next, Modification 2 will be described with reference to FIGS. 10C and 10G. FIGS. 10C and 10G are a schematic cross-sectional view and a schematic plan view, respectively, corresponding to each other and show a smooth concave shape as compared to that shown in FIGS. 10A and 10E. In FIG. 10C, a conductive material 1012 and a barrier metal 1013 form the bonding portion 311B. In addition, the upper face of the second wiring structure has an upper face 1008 of the interlayer insulating film and a concave portion 1009. The concave portion 1009 is different from the concave portion 704 shown in FIG. 10A, and the step has not a side face and has a concave shape with a curvature. A bottom face of the concave portion 1009 contains an upper face 1010 of a part of the interlayer insulating film 127 and an upper face 1011 of the bonding portion 311B. In addition, the concave portion 1009 has a step up to d1 between the upper face 1008 of the interlayer insulating film 127 and the upper face 1011 of the bonding portion 311B. In FIG. 10G, the concave portion 1009 has an area larger than that of the bonding portion 311B. A concave portion having the structure as described above can be obtained, in particular, by performing a CMP treatment. The structure as described above is also applicable to the concave portion of the present invention.

Figure 10H:
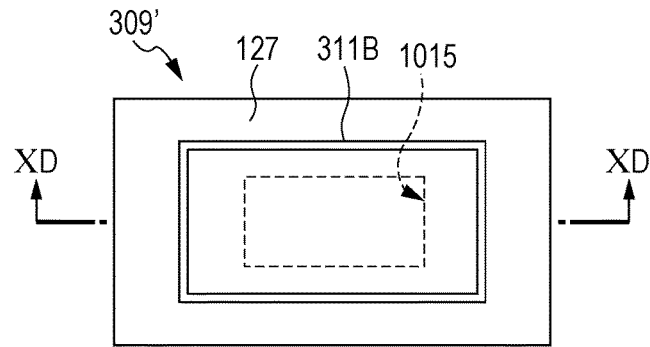
FIG. 10H is a schematic plan view illustrating the modification of the bonding portion.

Next, Modification 3 will be described with reference to FIGS. 10D and 10H. FIGS. 10D and 10H are a schematic cross-sectional view and a schematic plan view, respectively, corresponding to each other, and a small concave portion as compared to that shown in FIGS. 10C and 10G is formed. In FIG. 10D, a conductive material 1018 and a barrier metal 1019 form the bonding portion 311B. In addition, the upper face of the second wiring structure has an upper face 1014 of the interlayer insulating film, a concave portion 1015, and an upper face 1016 of a part of the bonding portion 311B. A bottom face of the concave portion 1015 contains an upper face 1017 of the bonding portion 311B. In addition, the concave portion 1015 has a step up to d1 between the upper face 1014 of the interlayer insulating film 127 and the upper face 1017 of the bonding portion 311B. In FIG. 10H, the concave portion 1015 has an area smaller than that of the bonding portion 311B. A concave portion having the structure as described above can be obtained, in particular, by performing a CMP treatment. The structure as described above is also applicable to the concave portion of the present invention.

As described above, as the structure of the concave portion of the upper face, a concave portion having a step as shown in FIG. 10A, a concave portion having a curvature as shown in FIG. 10C, and other arbitrary structures may be used. In addition, a step having an arbitrary size may be selected for each member. When the bonding portion 311B is viewed from the above in a direction perpendicular thereto, that is, in a plane layout, a plurality of concave portions each having an arbitrary shape may also be formed. Of course, it is possible to apply the structure of the concave portion of the upper face shown in each of FIGS. 10A to 10H to the first wiring structure.

Hereinafter, as one application example of the solid-state image pickup device of each of the above embodiments, an image pickup system incorporating a solid-state image pickup device will be described by way of example. In the image pickup system, besides devices, such as a camera, primarily used to pickup images, devices (such as a personal computer and a personal digital assistant) auxiliary having an image pickup function are also included. For example, a camera includes the solid-state image pickup device of the present invention and a processing portion which processes a signal outputted from the solid-state image pickup device. This processing portion may include, for example, an A-D converter and a processor processing a digital data outputted therefrom.

As has thus been described, according to the method for manufacturing a solid-state image pickup device of the present invention, a member for a solid-state image pickup device having a bonding structure which enables a bonding plane to be flat after bonding and a method for manufacturing the same can be provided.

In addition, the present invention is not limited to the structures described in the specification and may also be applied, for example, to the case in which the pixel circuit is changed, only the photoelectric converters are arranged on the first member, and/or all the pixel circuits are arranged thereon. Furthermore, the present invention may be appropriately applied, for example, to the structure in which the conductive and/or circuit type is changed to a reversed type, the structure in which a wiring layer and an interlayer insulating film are further provided, and the case in which a single damascene structure is changed to a dual damascene structure. In addition, the structures of the above embodiments may also be used in combination. In the present invention, the concave portion may be provided for at least one of members, and the shape of the upper face of the other member is not particularly limited.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

REFERENCE SIGNS LIST 301 pixel portion
302 peripheral circuit portion
308 first member
309 second member
149 first wiring structure
150 second wiring structure
311 bonding portion
312 pad portion
313 pad
101 first substrate
121 second substrate
100 opening
X bonding plane

The invention claimed is:

1. A method for manufacturing a device, comprising:
providing a first member which includes a first substrate and a first structure on the first substrate;
providing a second member which includes a second substrate and a second structure on the second substrate;
bonding the first member and the second member so that the first structure and the second structure are disposed between the first substrate and the second substrate,
wherein the first structure includes a first insulating film having a groove, includes a first portion containing copper in the groove of the first insulating film and includes a first film of barrier metal between the first portion and the first insulating film,
wherein the second structure includes a second insulating film having a groove, includes a second portion containing copper in the groove of the second insulating film and includes a second film of barrier metal between the second portion and the second insulating film,
wherein the bonding includes a first step and a second step after the first step,
wherein in the first step, the first insulating film and the second insulating film are bonded together whereas at least a first part of the first portion and at least a second part of the second portion face each other with a gap between the first part and the second part, and
wherein in the second step, the first part and the second part are bonded together.

2. The method according to claim 1, wherein in the first step, a distance between the first part and the second part is larger than a distance between the first insulating film and the second film and/or a distance between the first film and the second insulating film.

3. The method according to claim 1, wherein in the first step, a distance between the first part and the second part is larger than a distance between the first film and the second film.

4. The method according to claim 1, wherein in the first step, a distance between the first part and the second part is smaller than a distance between the first film and the second film.

5. The method according to claim 1, wherein in the first step, a distance between the first insulating film and the second portion is larger than a distance between the first film and the second insulating film.

6. The method according to claim 1, wherein in the first step, a distance between the first film and the second film is smaller than a distance between the first insulating film and the second portion and/or a distance between the first portion and the second insulating film.

7. The method according to claim 1, wherein the first insulating film includes a silicon oxide film and/or a silicon nitride film, the second insulating film includes a silicon oxide film and/or a silicon nitride film, the first film contains tantalum and/or titanium, and the second film contains tantalum and/or titanium.

8. The method according to claim 1, wherein the first substrate includes a silicon semiconductor substrate, and the second substrate includes a silicon semiconductor substrate.

9. The method according to claim 8, wherein the first substrate is provided with a first transistor, and the second substrate is provided with a second transistor.

10. The method according to claim 1, wherein before the bonding, a plasma irradiation is performed on an upper face of the second structure.

11. The method according to claim 10, wherein the plasma irradiation is performed in a gas atmosphere of oxygen.

12. The method according to claim 10, wherein the plasma irradiation is performed in a gas atmosphere of nitrogen.

13. The method according to claim 1, wherein before the bonding, an upper face of the first structure has a first concave portion so that the first portion forms a bottom face of the first concave portion, and an upper face of the second structure has a second concave portion so that the second portion forms a bottom face of the second concave portion.

14. The method according to claim 1, wherein before the bonding, a chemical treatment is performed on an upper face of the second structure.

15. The method according to claim 1, wherein in the bonding, a heat treatment is performed.

16. The method according to claim 15, wherein the bonding is performed in a vacuum or an inert gas atmosphere.

17. The method according to claim 9, wherein after the bonding, a thickness of the first substrate is reduced.

18. The method according to claim 17, wherein after the bonding, an opening is formed in the first substrate.

19. The method according to claim 18, wherein after the bonding, a thickness of the second substrate is reduced.

20. The method according to claim 9, wherein the first substrate is provided with a photoelectric converter.

* * * * *